(12) United States Patent
Park et al.

(10) Patent No.: US 10,306,789 B2
(45) Date of Patent: May 28, 2019

(54) DISPLAY APPARATUS

(71) Applicant: SAMSUNG ELECTRONICS CO., LTD., Suwon-si (KR)

(72) Inventors: Yong Hwan Park, Hwaseong-si (KR); Won Kyu Park, Suwon-si (KR); Da Woon Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/860,219

(22) Filed: Jan. 2, 2018

(65) Prior Publication Data

US 2018/0192529 A1 Jul. 5, 2018

(30) Foreign Application Priority Data

Jan. 3, 2017 (KR) .................. 10-2017-0000674

(51) Int. Cl.
| | | |
|---|---|---|
| H05K 5/00 | (2006.01) |
| H05K 5/02 | (2006.01) |
| F16M 13/00 | (2006.01) |
| G02F 1/1333 | (2006.01) |
| G06F 1/16 | (2006.01) |
| H04N 5/64 | (2006.01) |
| H04N 5/655 | (2006.01) |
| H05K 5/03 | (2006.01) |

(52) U.S. Cl.
CPC .......... *H05K 5/0234* (2013.01); *F16M 13/00* (2013.01); *G02F 1/1333* (2013.01); *G02F 1/133345* (2013.01); *G06F 1/1601* (2013.01); *H04N 5/64* (2013.01); *H04N 5/655* (2013.01); *H05K 5/0017* (2013.01); *H05K 5/0217* (2013.01); *H05K 5/03* (2013.01)

(58) Field of Classification Search
CPC ........................................................ H05K 7/00
USPC ................................................... 361/679.01
See application file for complete search history.

(56) References Cited

U.S. PATENT DOCUMENTS

| | | | |
|---|---|---|---|
| 6,256,075 B1 | 7/2001 | Yang | |
| 2008/0122739 A1 | 5/2008 | Kim | |
| 2011/0116218 A1* | 5/2011 | Choi | H04N 5/64 |
| | | | 361/679.01 |

(Continued)

FOREIGN PATENT DOCUMENTS

| | | |
|---|---|---|
| EP | 2 549 746 A2 | 1/2013 |
| JP | 6-120684 A | 4/1994 |

(Continued)

OTHER PUBLICATIONS

Communication dated Apr. 18, 2018, issued by the European Patent Office in counterpart European Application No. 17210502.5.

*Primary Examiner* — Jerry Wu
(74) *Attorney, Agent, or Firm* — Sughrue Mion, PLLC

(57) ABSTRACT

A display apparatus may include a display unit that includes a bottom chassis made of metal, a metal stand to support the display unit, a fixing bracket that is fixed to the bottom chassis and the stand, and an insulating member that electrically separates the fixing bracket and the bottom chassis. Because the fixing bracket and the bottom chassis are electrically separated from each other via the insulating member, electromagnetic noise that is generated in the bottom chassis may be prevented from being transmitted to the stand despite the stand being mounted on the fixing bracket.

15 Claims, 9 Drawing Sheets

(56) References Cited

U.S. PATENT DOCUMENTS

2015/0064943 A1   3/2015   Wright et al.

FOREIGN PATENT DOCUMENTS

| JP | 2006-2887 A | | 1/2006 | |
|---|---|---|---|---|
| JP | 2006002887 A | * | 1/2006 | ............. E16B 43/00 |
| KR | 20-2010-00033240 U | | 3/2010 | |

* cited by examiner

DISPLAY APPARATUS

CROSS-REFERENCE TO RELATED APPLICATION(S)

This application claims priority from Korean Patent Application No. 10-2017-0000674, filed on Jan. 3, 2017 in the Korean Intellectual Property Office, the disclosure of which is incorporated herein by reference in its entirety.

BACKGROUND

1. Field

Apparatuses consistent with example embodiments relate to a display apparatus having a display unit and a stand supporting the display unit.

2. Description of Related Art

A display apparatus, such as a television (TV), a monitor, and/or the like, is an apparatus that receives an image signal to provide, for display, via a screen. Display apparatuses may include a display unit that is configured to display information via a screen, and a stand that is configured to support the display unit. Display apparatuses have been developed in such a way that the display apparatuses include large display units and stands having a slim appearance. As such, display apparatuses tend to use stands made of a metal material to permit support of large display units.

SUMMARY

Therefore, it is an aspect of the present disclosure to provide a display apparatus capable of electrically separating a bottom chassis formed of a metal material, from a stand formed of a metal material.

According to an aspect of an example embodiment, there is provide a display apparatus including: a display unit; and a stand that is formed of a first metal material and configured to support the display unit, wherein the display unit includes a bottom chassis that is formed of a second metal material, a fixing bracket that is fixed to the bottom chassis via a bolt and fixed to the stand, and an insulating member that is configured to electrically separate the bottom chassis from the fixing bracket, wherein the fixing bracket includes a stand fixing portion that is fixed to the stand, a bottom fixing portion that is fixed to the bottom chassis via the bolt, and a bracket through hole that is provided in the bottom fixing portion and receives a fastening portion of the bolt, and wherein the insulating member includes a rear cover portion that is configured to cover a rear surface of the bottom fixing portion, a front cover portion that is configured to cover a front surface of the bottom fixing portion, a rear through hole that is provided in the rear cover portion to correspond to the bracket through hole, a front through hole that is provided in the front cover portion to correspond to the bracket through hole, and a hole cover portion that is disposed inside of the bracket through hole.

The hole cover portion may extend from the rear cover portion to an inside of the bracket through hole.

The hole cover portion may extend from the front cover portion to an inside of the bracket through hole.

A head portion of the bolt may be supported by the bracket through hole, and the fastening portion of the bolt may include male threads and may be spaced apart from an inner surface of the bracket through hole, and the bottom chassis may include a fastening hole that is provided with female threads to permit the male threads of the fastening portion of the bolt to be coupled to the fastening hole.

The insulating member may further include a connecting portion that is configured to connect the front cover portion to the rear cover portion.

The stand fixing portion may include the bottom fixing portion that is disposed at a first end of the stand fixing portion, and another bottom fixing portion that is disposed at a second end of the stand fixing portion, and the insulating member may be fixed to the bottom fixing portion, and another insulating member may be fixed to the other bottom fixing portion.

The stand fixing portion may protrude from a rear side of the fixing bracket and may be spaced apart from a rear surface of the bottom chassis.

The stand may include a leg portion that is configured to support the display apparatus on a surface, a neck portion that extends from a center of the leg portion to a fixing plate of the stand, and the fixing plate that is provided in an upper end of the neck portion and is configured to be fixed to the stand fixing portion of the bottom chassis, and the leg portion, the neck portion, and the fixing plate may be formed of the second metal material.

The stand may include a neck cover that is formed of a resin material and configured to cover a neck portion of the stand.

The rear cover portion of the insulating member may be separate from the front cover portion of the insulating member.

According to an aspect of another example embodiment, there is provided display apparatus including: a display unit; and a stand that is formed of a first metal material and configured to support the display unit, wherein the display unit includes a bottom chassis that is formed of a second metal material, a fixing bracket that is fixed to the bottom chassis via a coupling member and fixed to the stand, and an insulating member that is configured to electrically separate the bottom chassis from the fixing bracket, wherein the fixing bracket includes a bracket through hole that receives the coupling member, and wherein the insulating member includes a rear cover portion that is configured to insulate the fixing bracket from the coupling member, a front cover portion that is configured to insulate the fixing bracket from the bottom chassis, and a hole cover portion that extends to an inside of the bracket through hole to insulate the coupling member from an inner surface of the bracket through hole.

The insulating member may further include a connecting portion that is configured to connect the rear cover portion to the front cover portion.

The hole cover portion may extend from the rear cover portion to the inside of the bracket through hole.

The hole cover portion may extend from the front cover portion to the inside of the bracket through hole.

The hole cover portion may be separate from the front cover portion of the insulating member and the rear cover portion of the insulating member and may be fitted on the coupling member.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Figure 1:
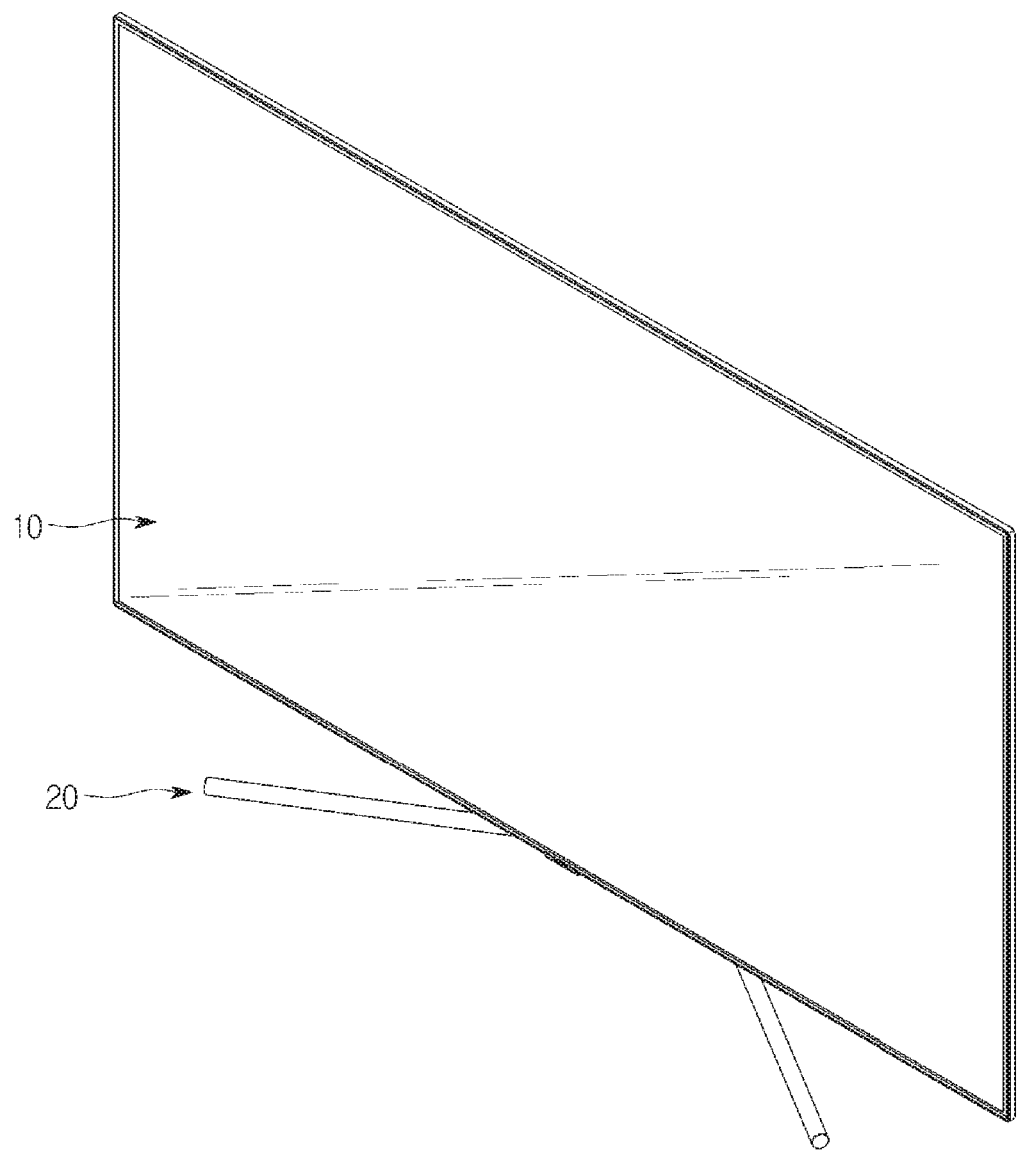
FIG. 1 is a front perspective view of a display apparatus according to an example embodiment.

Embodiments described herein and shown in the drawings are merely examples that may be modified in various different ways.

In addition, the same reference numerals or signs shown in the drawings indicate elements or components that may perform substantially the same function.

Also, the terms used herein are used to describe example embodiments and are not intended to limit or restrict the present disclosure. The singular forms of terms designated by "a," "an," and "the" are intended to include the plural forms of the terms as well, unless the context clearly indicates otherwise. In the present disclosure, the terms "including," "having," and/or the like are used to specify features, numbers, steps, operations, elements, components, and/or combinations thereof, but do not preclude the presence or addition of one or more of the features, elements, steps, operations, elements, components, and/or combinations thereof.

It should be understood that the terms "first," "second," "third," etc. may be used herein to describe various elements, but the various elements are not limited by these terms. These terms may be used to distinguish an element from another element. Additionally, a first element may be termed as a second element, and a second element may be termed as a first element.

The term "and/or" includes a set of combinations of relevant items or any particular item of a set of relevant items.

Figure 2:
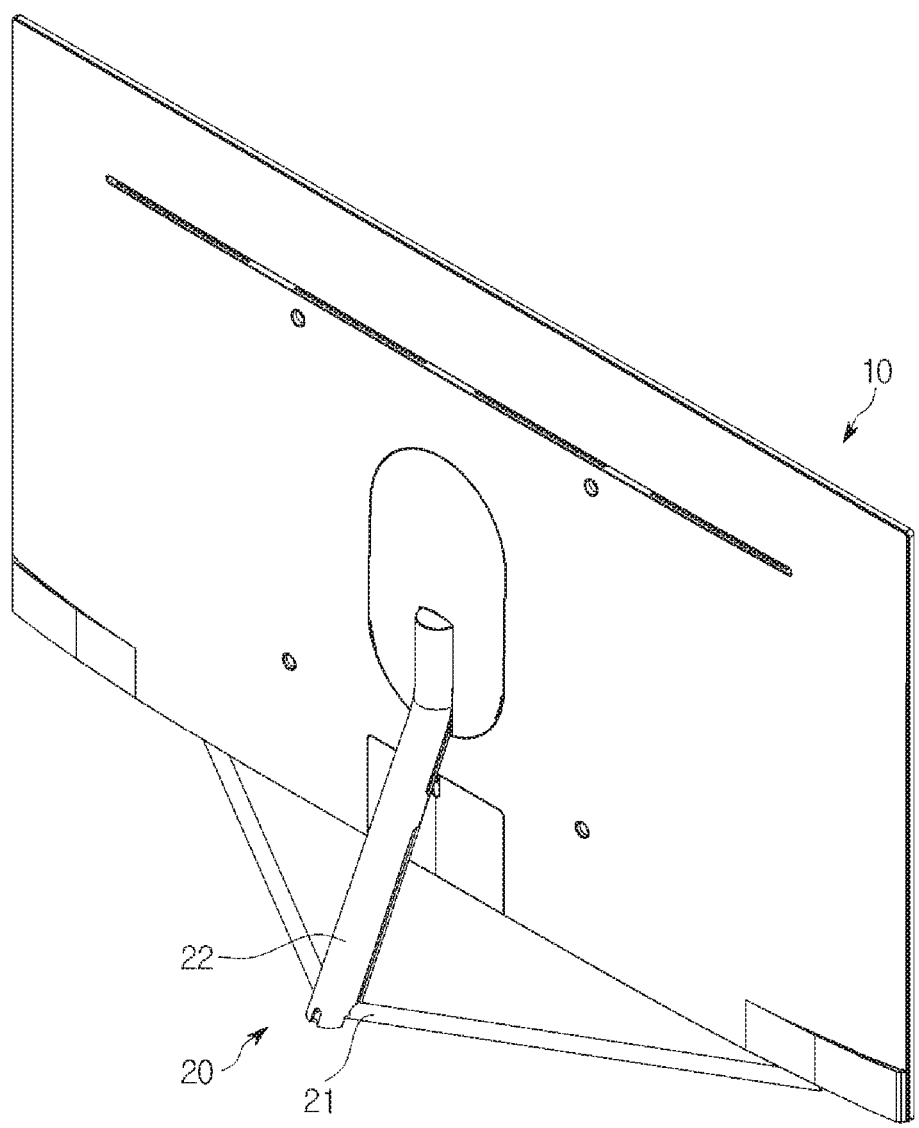
FIG. 2 is a rear perspective view of the display apparatus according to an example embodiment.

Example embodiments will be described in more detail below with reference to the accompanying drawings As shown in FIGS. 1 and 2, and according to an example embodiment, a display apparatus includes a display unit 10 that is configured to provide information, for display, via a screen, and a stand 20 that is configured to support the display unit 10.

Figure 3:
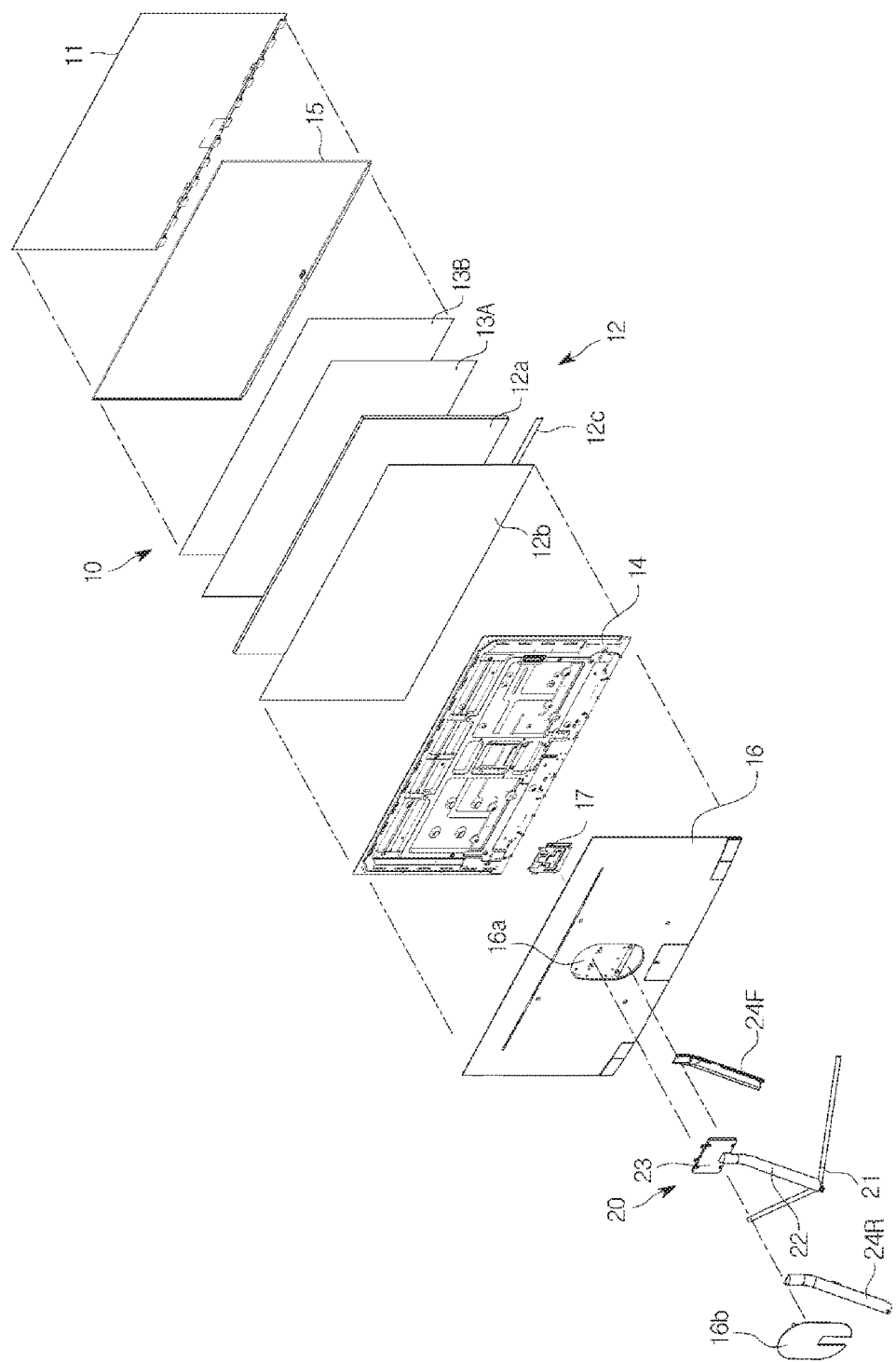
FIG. 3 is a rear exploded perspective view of the display apparatus according to an example embodiment.

As shown in FIG. 3, the display unit 10 includes a display panel 11 that is configured to provide information for display, a backlight 12 that is configured to supply light to the display panel 11, and optical sheets 13A and 13B that are disposed between the display panel 11 and the backlight 12 to improve the optical characteristics of light that is supplied from the backlight 12.

The display unit 10 includes a frame case 15 that is configured to support the outer side of the display panel 11, a bottom chassis 14 that is configured to accommodate and support the backlight 12, and a rear case 16 that is configured to cover the rear side of the bottom chassis 14 to form a rear surface of the display unit 10.

The display panel 11 includes a liquid crystal display panel that is formed by sealing liquid crystal between a pair of glass substrates formed in a rectangular plate shape.

The backlight 12 includes a light guide plate 12a that is formed in a rectangular plate shape and that is spaced apart from the rear side of the display panel 11, a light source 12c that is disposed at the lower end of the light guide plate 12a and that is configured to generate light, and a white reflective sheet 12b that is disposed on the rear surface of the light guide plate 12a and that is configured to reflect light.

The light source 12c includes a printed circuit board that is horizontally elongated to correspond to the lower end of the light guide plate 12a, and light emitting diodes that are disposed at a first side and a second side in the printed circuit board and that are configured to generate light.

The optical sheets 13A and 13B are provided with a diffuser sheet that is configured to receive and diffuse light that is emitted from the light guide plate 12a in a direction towards display panel 11. The optical sheets 13A and 13B further include a Dual Brightness Enhancement Film (DBEF) sheet that corresponds to a high brightness prism, and that is provided in front of the diffuser sheet.

The frame case 15 is formed in a rectangular ring shape, and supports the outer side of the display panel 11 that is also formed in a rectangular plate shape.

The bottom chassis 14 includes an open front surface that accommodates the backlight 12. The bottom chassis 14 is formed of a metal material to provide strength and to permit dissipation of heat generated by the backlight 12.

One or more printed circuit boards that are configured to control the operation of the display apparatus are disposed on the rear surface of the bottom chassis 14. The one or more printed circuit boards include a power source substrate that is configured to supply power to the display unit 10, a panel drive substrate that is configured to drive the display panel 11, a timing control substrate that is configured to transmit an image signal to the display panel 11, and a signal processing board that is configured to process signals (e.g., an image signal, a sound signal, and/or the like).

The rear case 16 is configured to cover the rear side of the bottom chassis 14 and thereby cover the one or more printed circuit boards that are disposed in the rear surface of the bottom chassis 14. The rear case 16 includes a receiving portion 16a that is recessed at the center of the rear side of the rear case 16 and that is configured to accommodate a fixing plate 23 of the stand 20, and a fixing plate cover 16b that is configured to cover the receiving portion 16a and thereby conceal the fixing plate 23.

The stand 20 includes a leg portion 21 that is configured to support the display unit 10 on a surface, a neck portion 22 that is connected at a lower end to a center of the leg portion 21 and that extends vertically, a fixing plate 23 that is provided at an upper end of the neck portion 22 and that permits connection to display unit 10, and neck covers 24F and 24R that are configured to cover and conceal the neck portion 22.

The leg portion 21 extends obliquely in a horizontal direction and a frontward direction to form a substantially V shape.

The lower end of the neck portion 22 is coupled to the center of the leg portion 21. The neck portion 22 may be provided with grooves for receiving electric wires or grooves for reducing the weight of the stand 20.

The fixing plate 23 is formed in a rectangular plate shape and is integrally formed at the upper end of the neck portion 22.

According to an example embodiment, the leg portion 21, the neck portion 22, and the fixing plate 23 of the stand 20 are configured to directly support a weight of the display unit 10. As such, the leg portion 21, the neck portion 22, and the fixing plate 23 are respectively formed of a metal material to provide strength to support the display unit 10.

The neck covers 24F and 24R include a pair of neck covers 24F and 24R that are each formed of a lightweight resin material, and that are coupled to each other to conceal the neck portion 22. The neck covers 24F and 24F improve the design of the neck portion 22 by covering and concealing the grooves and/or wires provided in the neck portion 22.

Figure 4:
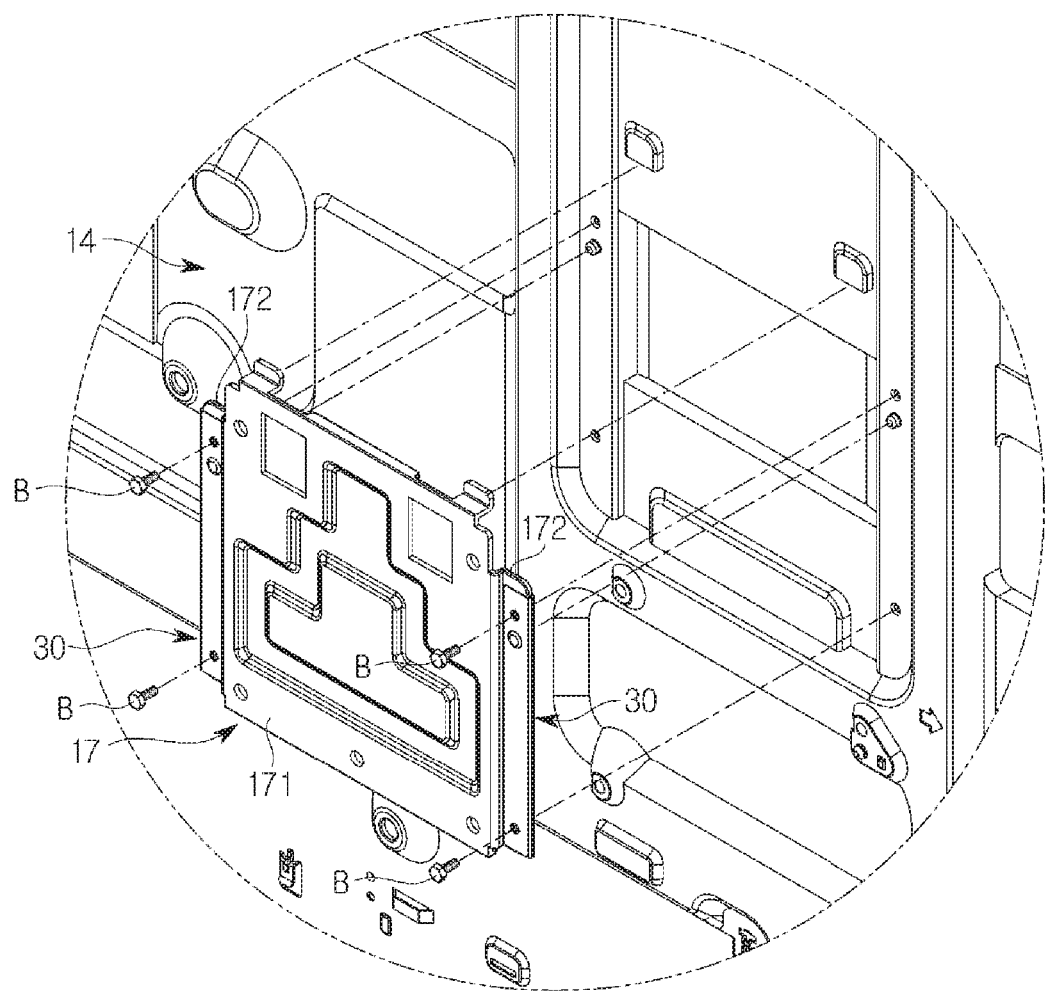
FIG. 4 is an exploded perspective view of a fixing bracket of the display apparatus according to an example embodiment.
Figure 5:
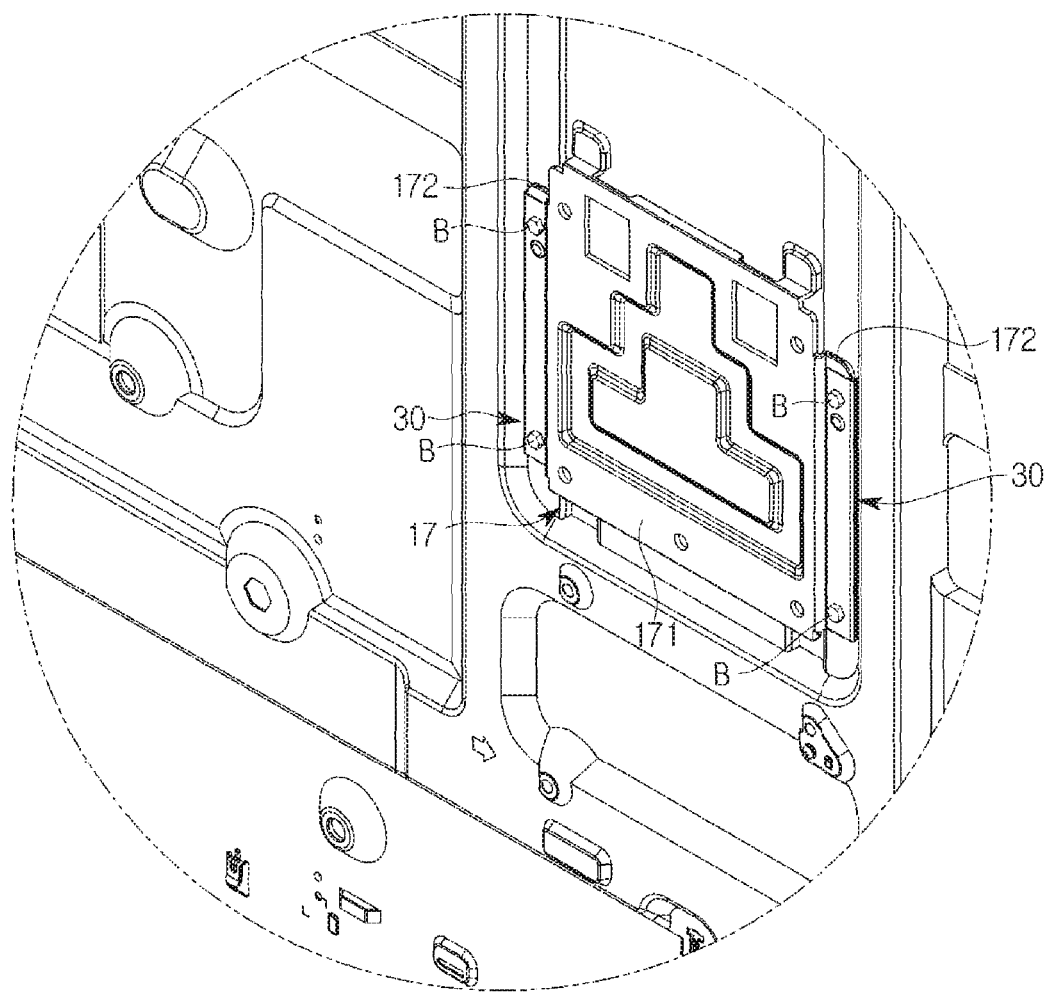
FIG. 5 is a perspective view of the fixing bracket of the display apparatus according to an example embodiment.

As shown in FIGS. 4 and 5, a fixing bracket 17 that is configured to fix to the stand 20 is provided on the rear surface of the bottom chassis 14 to permit the display unit 10 to be fixed to the stand 20.

The fixing bracket 17 is formed of a metal material that is capable of supporting the weight of the display unit 10. The fixing bracket 17 includes a stand fixing portion 171 that is fixed to the stand 20, and a bottom fixing portion 172 that is fixed to the bottom chassis 14. An insulating member 30 is connected to the bottom fixing portion 172, and thus the fixing bracket 17 is fixed to the bottom chassis 14 in a state in which the fixing bracket 17 is connected to the insulating member 30. According to an example embodiment, the fixing bracket 17 is fixed to a central portion of the rear surface of the bottom chassis 14, and the fixing plate 23 of the stand 20 is fixed to the fixing bracket 17 to permit the stand 20 to support the weight of the display unit 10 through the central portion of the bottom chassis 14.

According to an example embodiment, the stand fixing portion 171 protrudes in a rearward direction, and the front surface of the stand fixing portion 171 is spaced apart from the rear surface of the bottom chassis 14 to permit a coupling member, such as a bolt, a nut, and/or the like, to be disposed in a space between the stand fixing portion 171 and the rear surface of the bottom chassis 14.

The fixing plate 23 of the stand 20 is fixed to the stand fixing portion 171 via a coupling member. The fixing plate 23 and the stand fixing portion 171 are fixed to each other while the receiving portion 16a of the rear case 16 is interposed.

Figure 7:
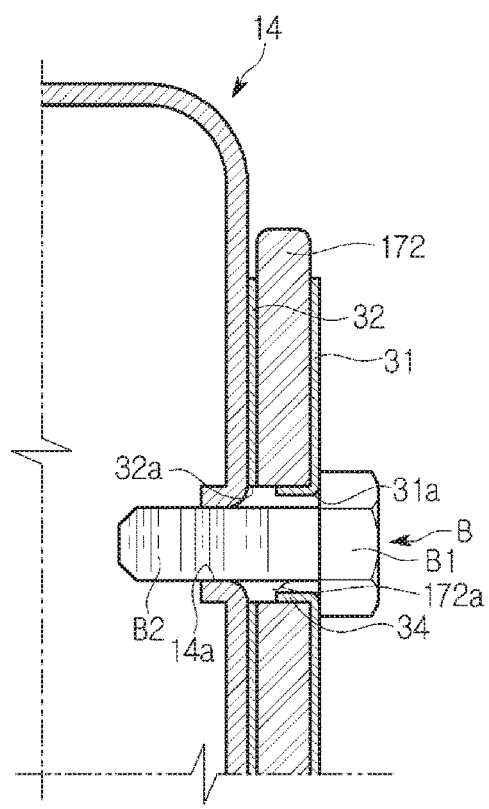
FIG. 7 is a cross-sectional view of the insulating member of the display apparatus according to an example embodiment.

As shown in FIG. 7, the bottom fixing portion 172 is fixed to the bottom chassis 14 via a bolt B. The bottom fixing portion 172 is provided with a bracket through hole 172a that is configured to receive the bolt B. For example, the bracket through hole 172a permits penetration, through bracket through hole 172a, of a fastening portion B2 of the bolt B having male threads, while being configured to prevent penetration, through bracket through hole 172a, of a head portion B1 of the bolt B. A diameter of the bracket through hole 172a is formed to be larger than an outer diameter of the fastening portion B2 of the bolt B such that the inner surface of the bracket through hole 172a is maintained to be spaced apart from the fastening portion B2 of the bolt B.

Therefore, the head portion B1 of the bolt B is supported by the bracket through hole 172a in a vicinity of a rear through hole 31a of the rear cover portion 31, and the fastening portion B2 of the bolt B passes through the bracket through hole 172a in a state of being spaced apart from the inner circumferential surface of the bracket through hole 172a.

The bottom chassis 14 is provided with a fastening hole 14a that is provided at a position corresponding to the bracket through hole 172a, and that is provided with female threads formed on the inner surface of the fastening hole 14a.

According to an example embodiment, two bottom fixing portions 172 are vertically extended so that two bracket fixing holes 172a are vertically spaced from each other in the two bottom fixing portions 172. A total of four fastening holes 14a are provided in the bottom chassis 14 to correspond to the bracket through holes 172a provided in the bottom fixing portion 172.

As mentioned above, because the bottom chassis 14 is formed of a metal material, and the printed circuit boards are provided on the rear surface of the bottom chassis 14, electromagnetic noise is generated in the bottom chassis 14.

In addition, because the fixing bracket 17, the fixing plate 23, the neck portion 22, and the leg portion 21 of the stand 20 are all made of a metal material, electromagnetic noise that is generated in the bottom chassis 14 may be transmitted to the stand 20.

Therefore, the insulating member 30 is disposed between the bottom chassis 14 and the fixing bracket 17 such that the bottom chassis 14 and the fixing bracket 17 are electrically separated from each other.

The insulating member 30 is formed of an insulating material such as a rubber, a resin, and/or the like. The insulating member 30 is formed to have a substantially U-shaped cross-section to simultaneously cover the front and rear surfaces of the bottom fixing portion 172. As such, the bottom fixing portions 172 may be inserted into the inside of the insulating member 30. Because two bottom fixing portions 172 are provided, two insulating members 30 are provided and then fitted on corresponding bottom fixing portions 172.

Figure 6:
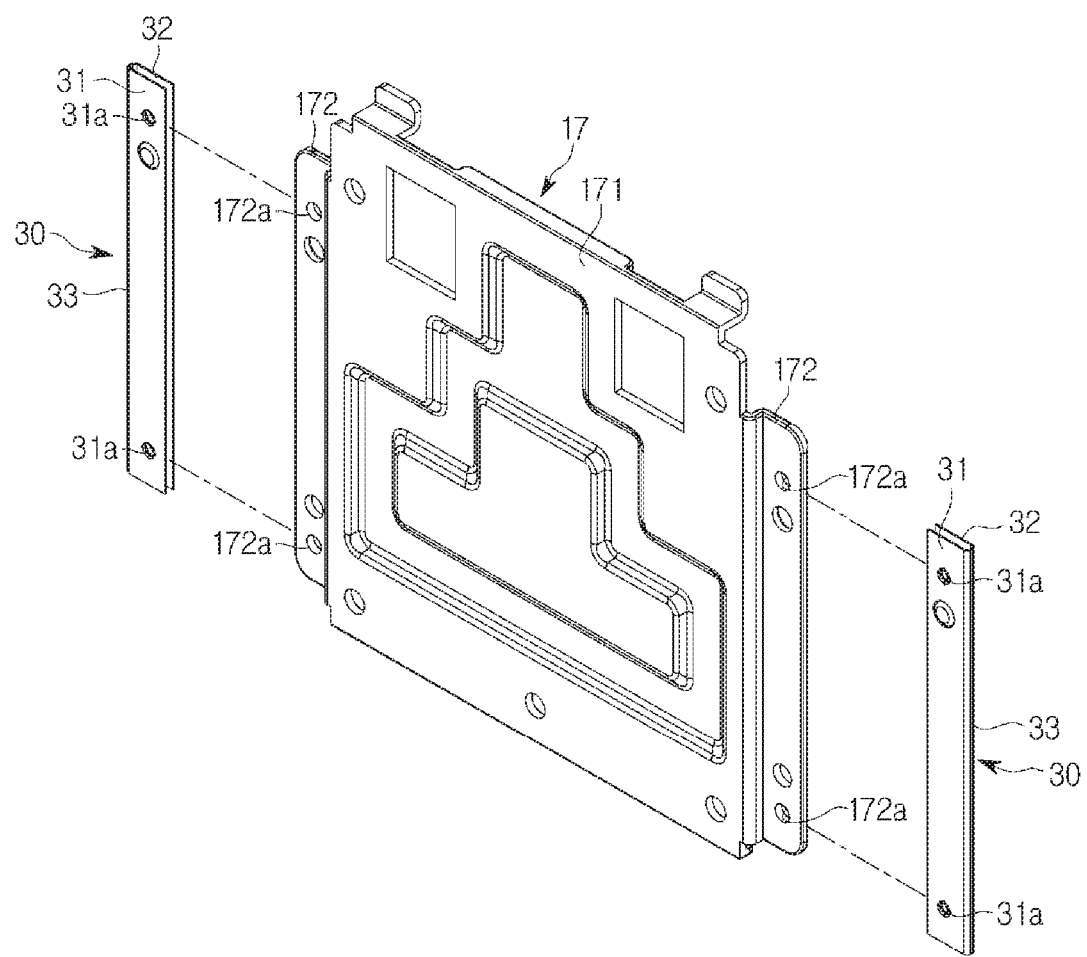
FIG. 6 is an exploded perspective view of an insulating member of the display apparatus according to an example embodiment.

As shown in FIG. 6, the insulating member 30 includes a front cover portion 32 that is configured to cover the front surface of the bottom fixing portion 172, and to insulate the front surface of the bottom fixing portion 172 from the rear surface of the bottom chassis 14. Further, the insulating member 30 includes a rear cover portion 31 that is configured to cover the rear surface of the bottom fixing portion 172, and to insulate the head portion B1 of the bolt B from the rear surface of the bottom fixing portion 172. Still further, the insulating member 30 includes a connecting portion 33 that is configured to connect the front cover portion 32 to the rear cover portion 31.

As shown in FIG. 7, the insulating member 30 includes a front through hole 32a that is provided in the front cover portion 32 to correspond to the fastening hole 14a, and a rear through hole 31a that is provided in the rear cover portion 31 to correspond to the bracket through hole 172a.

Figure 8:
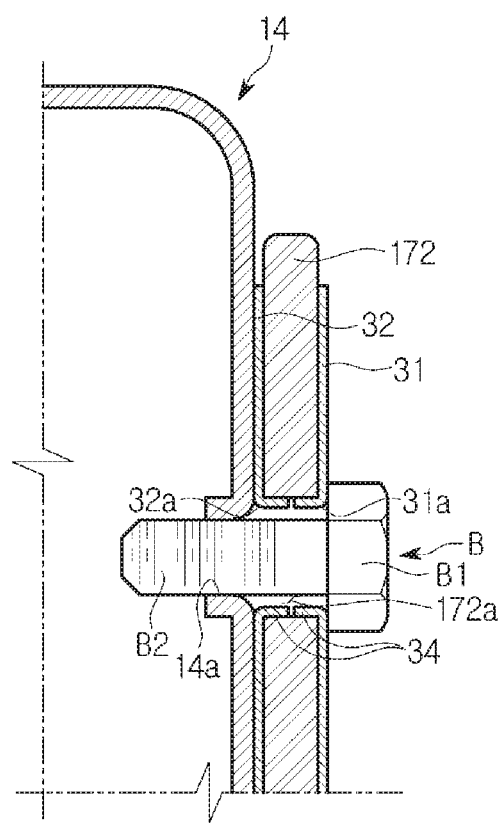
FIG. 8 is a cross-sectional view of the fixing bracket and the insulating member of the display apparatus according to an example embodiment.

As shown in FIG. 8, the insulating member 30 includes a hole cover portion 34 to prevent the fastening portion B2 of the bolt B from contacting the inner surface of the bracket through hole 172a. According to an example embodiment, the hole cover portion 34 integrally extends forward from the vicinity of the rear through hole 31a of the rear cover portion 31 to cover the inner surface of the bracket through hole 172a. For example, the hole cover portion 34 may be disposed inside of the bracket through hole 172a.

Therefore, because the front cover portion 32 is disposed between the bottom chassis 14 and the fixing bracket 17, the bottom chassis 14 and the fixing bracket 17 are electrically separated from each other. In addition, because the rear cover portion 31 is disposed between the head portion B1 of the bolt B that is fastened to the bottom chassis 14 and the fixing bracket 17, and because the hole cover portion 34 is disposed between the fastening portion B2 of the bolt B and the fixing bracket 17, the bolt B and the fixing bracket 17 are electrically separated from each other.

Therefore, the bottom chassis 14 and the fixing bracket 17 are electrically separated from each other via the insulating member 30 such that the generated electromagnetic noise is not transmitted to the stand 20 despite the fixing plate 23 of the stand 20 being fixed to the fixing bracket 17.

According to an example embodiment, the hole cover portion 34 is formed on the rear cover portion 31. According to another example embodiment, and as shown in FIG. 8, the hole cover portion 34 may be formed on the rear cover portion 31 and on the front cover portion 32.

That is, the hole cover portion 34 is integrally extended from the vicinity of the front through hole 32a of the front cover portion 32 to the rear side of the insulating member 30, such that the fastening portion B2 of the bolt B may be more reliably separated from the inner surface of the bracket through hole 172a than as compared to a situation where the hole cover portion 34 does not extend from the vicinity of the front through hole 32a. Alternatively, the hole cover portion 34 may extend integrally from the front cover portion 32 and might not extend from the rear cover portion 31. In addition, the hole cover portion 34 may be formed separately from the insulating member 30, and may be capable of being fitted around the fastening portion of the bolt B.

Figure 9:
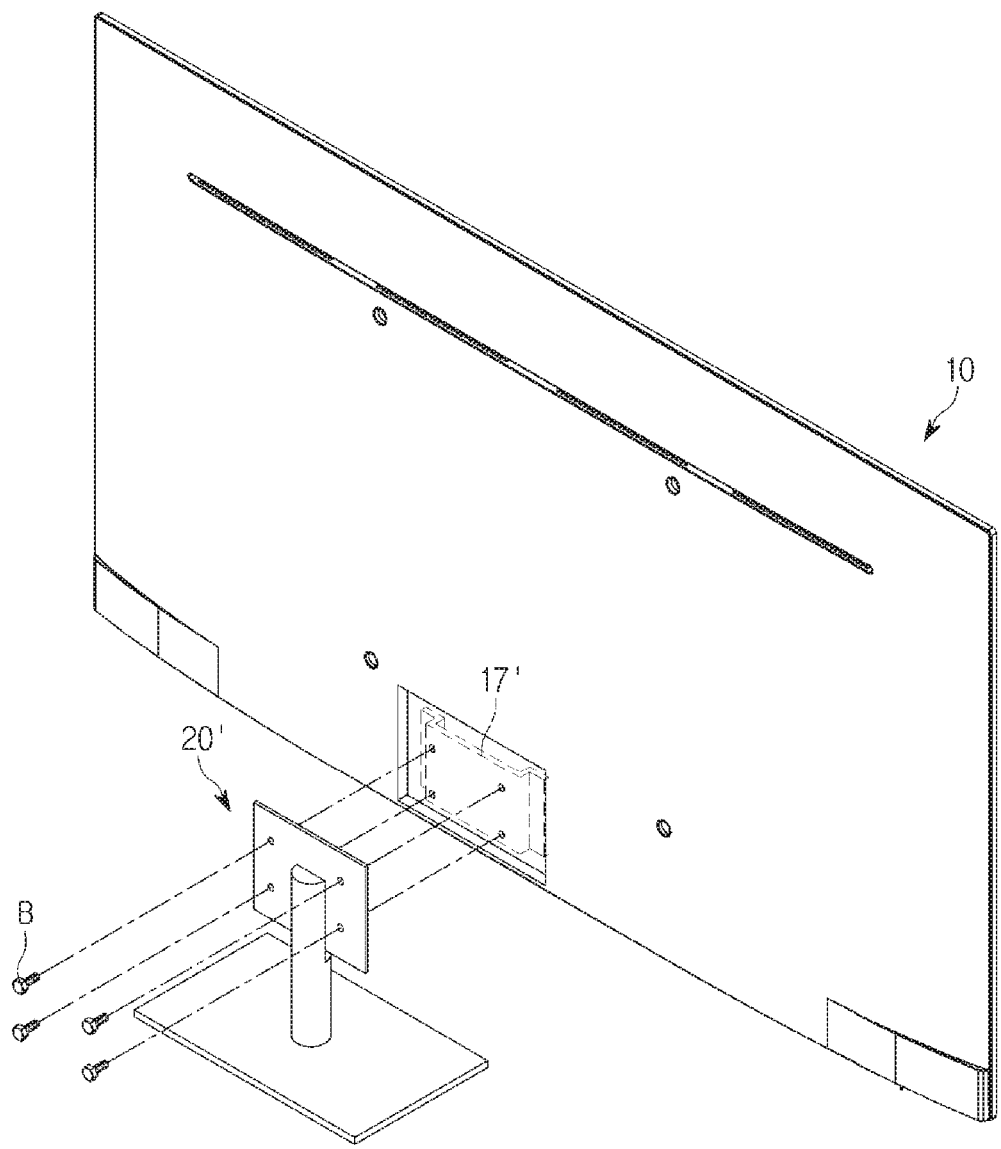
FIG. 9 is a perspective view of a stand of the display apparatus according to an example embodiment.

According to an example embodiment, the insulating member 30 is formed to have a substantially U-shaped cross section, and is formed to be fitted to the bottom fixing portion 172. Alternatively, the front cover portion 32 and the rear cover portion 31 of the insulating member may be formed by separate insulating members 30. In this case, the front cover portion 32 and the rear cover portion 31 may be adhered to the front and rear surfaces of the bottom fixing portion 172 via a double-sided tape, or the like According to an example embodiment, the stand 20 is installed on the fixing bracket 17 that is fixed to the center of the rear surface of the bottom chassis 14. Alternatively, and as shown in FIG. 9, a fixing bracket 17' is installed in the center of the lower portion of a bottom chassis 14 inside of the display unit 10, and a stand 20' is fixed to the fixing bracket 17' via a coupling member (e.g., bolt B) to permit the stand 20' to support the display unit 10 through the center of the lower portion of the bottom chassis.

According to an example embodiment, the stand 20 includes the neck covers 24F and 24R that cover the neck portion 22 and conceal the grooves formed in the neck portion 22. Alternatively, other example embodiments might not include the neck covers 24F and 24R.

As is apparent from the above description, the bottom fixing portion 172 of the fixing bracket 17 to which the stand 20 is fixed is electrically separated from the bottom chassis 14 by the insulating member 30, and thus electromagnetic noise that is generated in the bottom chassis 14 is prevented from being transmitted to the stand 20.

Although example embodiments of the present disclosure have been shown in the figures and described herein, it should be appreciated by those skilled in the art that changes may be made to the example embodiments without departing from the principles and spirit of the present disclosure, the scope of which is defined in the claims and their equivalents.

What is claimed is:
1. A display apparatus comprising:
    a display unit; and
    a stand that is formed of a first metal material and configured to support the display unit,
    wherein the display unit comprises:
    a bottom chassis that is formed of a second metal material different from the first metal material to permit more dissipation of heat generated by a backlight, wherein the bottom chassis comprises a fastening hole provided with a thread,
        at least one printed circuit board that is configured to control operation of the display apparatus and that is disposed on an inner surface of the bottom chassis,
        a fixing bracket that is fixed to the bottom chassis via a bolt and fixed to the stand, and
        an insulating member that is configured to electrically separate the bottom chassis from the fixing bracket and to prevent electromagnetic noise that is generated in the bottom chassis from being provided to the stand,
    wherein the fixing bracket comprises a stand fixing portion that is fixed to the stand, a bottom fixing portion that is fixed to the thread via the bolt, and a bracket through hole that is provided in the bottom fixing portion and receives a fastening portion of the bolt, and
    wherein the insulating member comprises a rear cover portion that is configured to cover a rear surface of the bottom fixing portion, a front cover portion that is configured to cover a front surface of the bottom fixing portion, a rear through hole that is provided in the rear cover portion to correspond to the bracket through hole, a front through hole that is provided in the front cover portion to correspond to the bracket through hole, and a hole cover portion that is disposed inside of the bracket through hole.

2. The display apparatus of claim 1, wherein the hole cover portion extends from the rear cover portion to an inside of the bracket through hole.

3. The display apparatus of claim 1, wherein the hole cover portion extends from the front cover portion to an inside of the bracket through hole.

4. The display apparatus of claim 1, wherein a head portion of the bolt is supported by the bracket through hole, and the fastening portion of the bolt includes a male thread and is spaced apart from an inner surface of the bracket through hole, and
    wherein the thread of the fastening hole is a female thread that permits the male thread of the fastening portion of the bolt to be coupled to the fastening hole.

5. The display apparatus of claim 1, wherein the insulating member further comprises a connecting portion that is configured to connect the front cover portion to the rear cover portion.

6. The display apparatus of claim 1, wherein the stand fixing portion comprises the bottom fixing portion that is disposed at a first end of the stand fixing portion, and another bottom fixing portion that is disposed at a second end of the stand fixing portion, and
    wherein the insulating member is fixed to the bottom fixing portion, and another insulating member is fixed to the other bottom fixing portion.

7. The display apparatus of claim 1, wherein the stand fixing portion protrudes from a rear side of the fixing bracket and is spaced apart from a rear surface of the bottom chassis.

8. The display apparatus of claim 1, wherein the stand comprises a leg portion that is configured to support the display apparatus on a surface, a neck portion that extends from a center of the leg portion to a fixing plate of the stand, and the fixing plate that is provided in an upper end of the neck portion and is configured to be fixed to the stand fixing portion of the bottom chassis, and wherein the leg portion, the neck portion, and the fixing plate are formed of the second metal material.

9. The display apparatus of claim 1, wherein the stand comprises a neck cover that is formed of a resin material and configured to cover a neck portion of the stand.

10. The display apparatus of claim 1, wherein the rear cover portion of the insulating member is separate from the front cover portion of the insulating member.

11. A display apparatus comprising:

a display unit; and a stand that is formed of a first metal material and configured to support the display unit, wherein the display unit comprises:

a bottom chassis that is formed of a second metal material different from the first metal material to permit more dissipation of heat generated by a backlight, wherein the bottom chassis comprises a fastening hole provided with a thread;

at least one printed circuit board that is configured to control operation of the display apparatus and is disposed on an inner surface of the bottom chassis, a fixing bracket that is fixed to the thread via a coupling member and fixed to the stand, and an insulating member that is configured to electrically separate the bottom chassis from the fixing bracket and to prevent electromagnetic noise that is generated in the bottom chassis from being provided to the stand, wherein the fixing bracket comprises a bracket through hole that receives the coupling member, and wherein the insulating member comprises a rear cover portion that is configured to insulate the fixing bracket from the coupling member, a front cover portion that is configured to insulate the fixing bracket from the bottom chassis, and a hole cover portion that extends to an inside of the bracket through hole to insulate the coupling member from an inner surface of the bracket through hole.

12. The display apparatus of claim 11, wherein the insulating member further comprises a connecting portion that is configured to connect the rear cover portion to the front cover portion.

13. The display apparatus of claim 11, wherein the hole cover portion extends from the rear cover portion to the inside of the bracket through hole.

14. The display apparatus of claim 11, wherein the hole cover portion extends from the front cover portion to the inside of the bracket through hole.

15. The display apparatus of claim 11, wherein the hole cover portion is separate from the front cover portion of the insulating member and the rear cover portion of the insulating member and is fitted on the coupling member.

* * * * *